(12) United States Patent
Chen et al.

(10) Patent No.: US 11,121,230 B2
(45) Date of Patent: Sep. 14, 2021

(54) STRUCTURES AND METHODS FOR CONTROLLING DOPANT DIFFUSION AND ACTIVATION

(71) Applicant: Taiwan Semiconductor Manufacturing Co., Ltd., Hsinchu (TW)

(72) Inventors: Ching-Yu Chen, Hsin-Chu (TW); Wei-Ting Chang, Hsin-Chu (TW); Yu-Shine Lin, Zhubei (TW); Jiang-He Xie, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/575,668

(22) Filed: Sep. 19, 2019

(65) Prior Publication Data

US 2020/0111891 A1    Apr. 9, 2020

Related U.S. Application Data

(60) Provisional application No. 62/734,414, filed on Sep. 21, 2018.

(51) Int. Cl.
| | |
|---|---|
| *H01L 29/66* | (2006.01) |
| *H01L 29/778* | (2006.01) |
| *H01L 29/207* | (2006.01) |
| *H01L 29/10* | (2006.01) |
| *H01L 21/02* | (2006.01) |

(Continued)

(52) U.S. Cl.
CPC .... *H01L 29/66462* (2013.01); *H01L 21/0254* (2013.01); *H01L 21/02579* (2013.01); *H01L 29/10* (2013.01); *H01L 29/207* (2013.01); *H01L 29/7787* (2013.01); *H01L 21/0262* (2013.01); *H01L 29/2003* (2013.01); *H01L 29/205* (2013.01)

(58) Field of Classification Search
CPC .......... H01L 29/66462; H01L 29/7787; H01L 29/207; H01L 29/10; H01L 29/2003; H01L 29/205; H01L 29/1066; H01L 29/7786; H01L 21/02579; H01L 21/0254; H01L 21/0262

See application file for complete search history.

(56) References Cited

U.S. PATENT DOCUMENTS

| | | | | |
|---|---|---|---|---|
| 2010/0258841 | A1* | 10/2010 | Lidow | H01L 29/475 257/192 |
| 2011/0266554 | A1* | 11/2011 | Hikita | H01L 29/7787 257/76 |
| 2012/0086049 | A1 | 4/2012 | Hwang et al. | |

(Continued)

*Primary Examiner* — Robert G Bachner
(74) *Attorney, Agent, or Firm* — Duane Morris LLP

(57) ABSTRACT

Structures and methods for controlling dopant diffusion and activation are disclosed. In one example, a semiconductor structure is disclosed. The semiconductor structure includes: a channel layer; a barrier layer over the channel layer; a gate electrode over the barrier layer; and a doped layer formed between the barrier layer and the gate electrode. The doped layer includes (a) an interface layer in contact with the barrier layer and (b) a main layer between the interface layer and the gate electrode. The doped layer comprises a dopant whose doping concentration in the interface layer is lower than that in the main layer.

18 Claims, 6 Drawing Sheets

(51) Int. Cl.
*H01L 29/20* (2006.01)
*H01L 29/205* (2006.01)

(56) References Cited

U.S. PATENT DOCUMENTS

| | | | |
|---|---|---|---|
| 2014/0264441 A1* | 9/2014 | Murase | H01L 29/66462 257/190 |
| 2015/0123139 A1 | 5/2015 | Kim et al. | |
| 2016/0233329 A1 | 8/2016 | Cheng | |
| 2017/0373177 A1* | 12/2017 | Benkhelifa | H01L 29/207 |
| 2018/0219106 A1* | 8/2018 | Odnoblyudov | H01L 29/0649 |
| 2019/0051732 A1* | 2/2019 | Stoffels | H01L 29/2003 |

* cited by examiner

STRUCTURES AND METHODS FOR CONTROLLING DOPANT DIFFUSION AND ACTIVATION

CROSS-REFERENCE TO RELATED APPLICATIONS

The present application claims priority benefit of U.S. Provisional Application No. 62/734,414, filed on Sep. 21, 2018, the contents of which are incorporated by reference in its entirety.

BACKGROUND

Due to high current density, high breakdown voltage, and low on-resistance, high electron mobility transistors (HEMTs) become popular to use in power applications. To develop an HEMT, e.g. a normally-off (enhanced-mode) HEMT with a p-type gallium nitride (GaN) gate, one of major difficulties is to control out-diffusion and activation of magnesium (Mg) or other dopants in the p-type GaN layer.

The key layers of a p-type GaN gate HEMT structure include a p-GaN layer and an aluminum gallium nitride (AlGaN)/GaN heterostructure. The p-GaN layer under the gate contact region controls the switch on and off of the HEMT; and the AlGaN/GaN interface forms a two dimensional electron gas (2DEG) channel between a source electrode and a drain electrode of the HEMT. In an existing HEMT structure, dopant in a Mg-doped p-GaN layer can easily out-diffuse into the AlGaN layer and lose activation of the dopant. Mg out-diffusion and non-activation in the AlGaN layer will form trapping centers in the AlGaN layer and reduce the 2DEG current. This makes the HEMT performance become poor, e.g. a higher on-resistance and/or a high temperature reverse bias (HTRB) degradation.

As such, existing HEMT structures are not entirely satisfactory in terms of dopant diffusion and activation.

BRIEF DESCRIPTION OF THE DRAWINGS

Aspects of the present disclosure are, best understood from the following detailed description when read with the accompanying figures. It is noted that various features are not necessarily drawn to scale. In fact, the dimensions and geometries of the various features may be arbitrarily increased or reduced for clarity of discussion. Like reference numerals denote like features throughout specification and drawings.

DETAILED DESCRIPTION OF EXEMPLARY EMBODIMENTS

Figure 1:
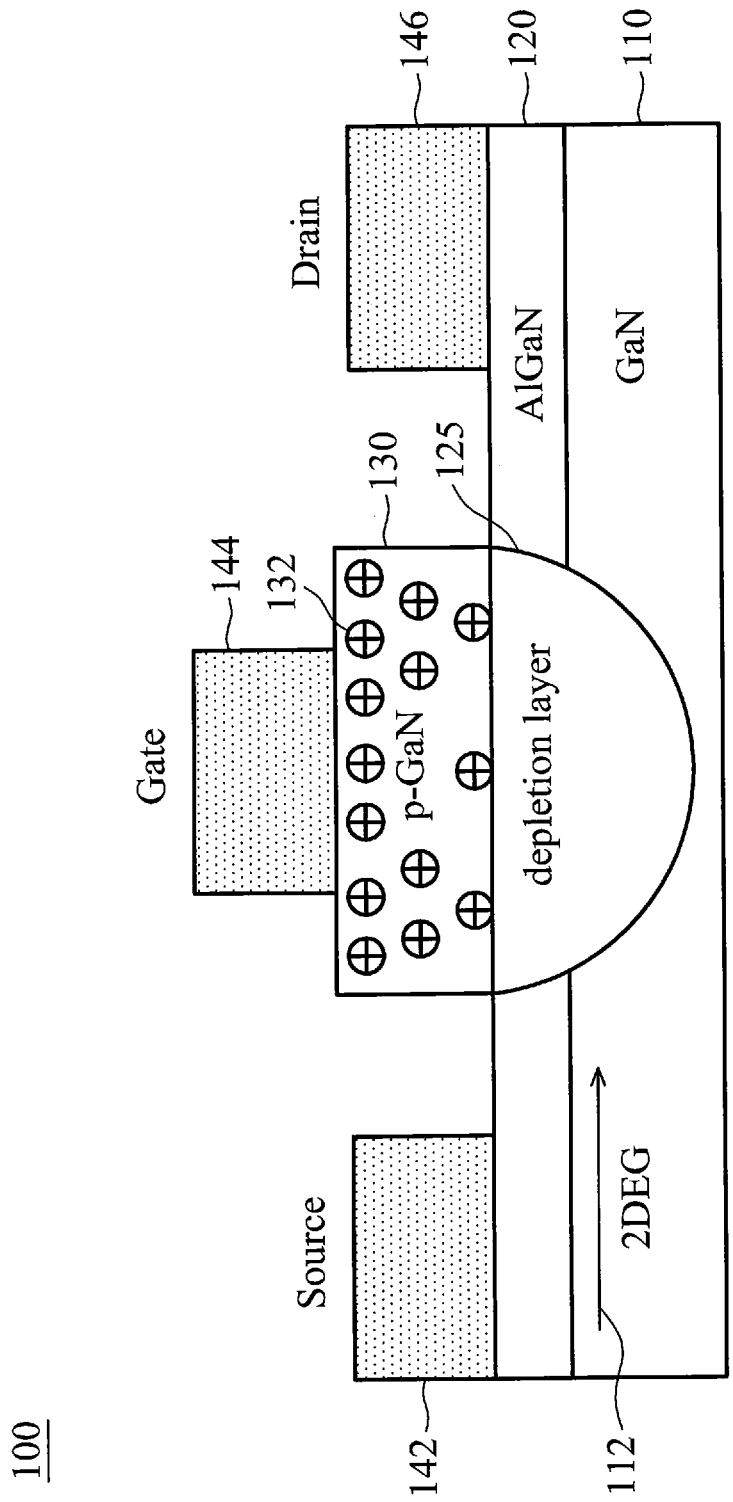
FIG. 1 illustrates a cross-sectional view of an exemplary semiconductor structure with controlled dopant diffusion and activation, in accordance with some embodiments of the present disclosure.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference will now be made in detail to the present embodiments of the disclosure, examples of which are illustrated in the accompanying drawings. Wherever possible, the same reference numbers are used in the drawings and the description to refer to the same or like parts.

To develop a high electron mobility transistor (HEMT), e.g. a normally-off (enhanced-mode) HEMT with a p-type gallium nitride (GaN) gate, one of major difficulties is to control out-diffusion and activation of magnesium (Mg) or other dopants in the p-type GaN (p-GaN) layer. The key layers of a p-type GaN gate HEMT structure include a p-GaN layer and an aluminum gallium nitride (AlGaN)/GaN heterostructure. To avoid the dopant Mg in a Mg-doped p-GaN layer out-diffusing into the AlGaN layer, the present disclosure provides various embodiments of structures and methods for controlling the out-diffusion and activation of the dopant. The present disclosure is applicable to any semiconductor structure with a potential dopant out-diffusion issue. The dopant Mg may be replaced with any p-type dopant, e.g. carbon (C), iron (Fe), zinc (Zn), etc., without impacting the effect of the disclosed structures and methods.

In some embodiments, a p-GaN gate transistor has a structure for controlling the out-diffusion and activation of the dopant in the p-GaN layer. For example, the transistor has a GaN channel layer, an AlGaN barrier layer over the GaN channel layer, and a doped p-GaN layer over the AlGaN barrier layer under the gate contact region. The p-GaN layer can deplete a two dimensional electron gas (2DEG) channel formed in the channel layer, and the more effective p-type dopant, e.g. Mg, can improve depletion ability of the p-GaN layer. The Mg out-diffusion occur during p-GaN layer deposition. To reduce or avoid the out-diffusion of Mg into the AlGaN barrier layer, the p-GaN layer is divided into two sub-layers, i.e. a main layer and an interface layer. The interface layer is in contact with the AlGaN barrier layer; while the main layer is on the interface layer and below the gate. The doping concentration of Mg in the interface layer is lower than that in the main layer, to reduce or avoid the out-diffusion of Mg into the AlGaN barrier layer.

In one example, the doping concentration of Mg in the interface layer is lowest at a surface of the barrier layer and gradually increases as Mg is farther away from the surface of the barrier layer. The doping concentration of Mg in the interface layer may follow a gradual profile with a lowest concentration at the surface of the barrier layer and a highest concentration at a surface of the main layer.

The doping concentration of Mg may be controlled by controlling a flow rate of Mg during doping. For example, in a metal organic chemical vapor deposition (MOCVD) system, the disclosed method includes controlling a bis(cyclopentadienyl)magnesium (Cp2Mg) flow to follow a parabolic function on the AlGaN/p-GaN interface to reduce or remove Mg out-diffusion. The parabolic function makes initial Mg flow low to suppress Mg out-diffusion, and keeps Mg flow high in the main p-GaN layer to maintain the p-GaN gate function, e.g. depleting 2DEG region, switching off device at 0 volt, etc. A reduction of Mg out-diffusion by doping flow profile control can eliminate trapping centers in the AlGaN barrier layer and avoid HEMT performance degradation, e.g. a higher on-resistance, a higher sheet resistance, or a high temperature reverse bias (HTRB) degradation, on the HEMT device.

In addition, the doping concentration of Mg in the main layer may be the same across the main layer and above a predetermined threshold, i.e. being kept at a high concentration level, to keep a sufficient activation of Mg for helping the p-GaN function of the gate. In one embodiment, the doping concentration of Mg in the entire p-GaN layer may increase gradually from a top surface of the AlGaN barrier layer to a bottom surface of the gate, e.g. Cp2Mg flow following a parabolic function. As such, the out-diffusion of a dopant can be solved without changing the total doping amount of the dopant. In another embodiment, a temperature of Mg is controlled during the doping such that Mg has a higher growth temperature in the main layer than that in the interface layer. Since a high temperature increases out-diffusion as well as activation of Mg, a lower temperature in the interface layer helps reducing Mg out-diffusion, while a higher temperature in the main layer helps activation of Mg.

FIG. 1 illustrates a cross-sectional view of an exemplary semiconductor structure 100 with controlled dopant diffusion, in accordance with some embodiments of the present disclosure. In accordance with one embodiment, the semiconductor structure 100 may be part of a transistor, e.g. a group III-V HEMT. Group III-V HEMTs on silicon substrates may be used as power switching transistors for voltage converter applications. Compared to silicon power transistors, III-V HEMTs feature low on-state resistances and low switching losses due to wide bandgap properties. In the present disclosure, a "group III-V semiconductor" refers to a compound semiconductor that includes at least one group III element and at least one group V element, such as, but not limited to, gallium nitride (GaN), aluminum gallium nitride (AlGaN), gallium arsenide (GaAs), indium aluminum gallium nitride (InAlGaN), indium gallium nitride (InGaN), etc. In a similar manner, a "III-nitride semiconductor" refers to a compound semiconductor that includes nitrogen and at least one group III element, such as, but not limited to, GaN, AlGaN, Indium nitride (InN), aluminum nitride (AlN), Indium gallium nitride (InGaN), Indium aluminum gallium nitride (InAlGaN), etc.

As shown in FIG. 1, the semiconductor structure 100 includes a channel layer 110, a barrier layer 120, a doped layer 130, a source electrode 142, a gate electrode 144, and a drain electrode 146. The channel layer 110 has a channel potential energy for containing a 2DEG 112, for improving current performance of the semiconductor structure 100. In some embodiments, the channel layer 110 includes one or more group III-V compound layers. For example, the channel layer 110 comprises GaN. One or more of the group III-V compound layers is doped in at least one embodiment. One or more of the group III-V compound layers is un-doped in at least one embodiment. In this example, the top portion of the channel layer 110 is in contact with the barrier layer 120 and comprises un-doped GaN. In one embodiment, the channel layer 110 is formed over a semiconductor substrate. In another embodiment, there may be other layers between the channel layer 110 and the substrate, e.g. a buffer layer, a transition layer, and/or an interlayer.

The barrier layer 120 in this example is formed over the channel layer 110. The barrier layer has a barrier potential energy for confining the 2DEG 112 in the channel layer 110. In some embodiments, the barrier layer 120 includes one or more group III-V compounds. For example, the barrier layer 120 comprises AlGaN or $Al_xGa_{1-x}N$ (with 0<x<1). Changing the Al composition and the thickness of the barrier layer 120 controls the threshold voltage of the transistor over a wide range. In one or more embodiments, the barrier layer 120 comprises un-doped AlGaN.

The source electrode 142 in this example is formed over the barrier layer 120 and is configured for supplying an input current to the 2DEG 112. The drain electrode 146 in this example is formed over the barrier layer 120 and is configured for supplying an output current. The input current flows from the source electrode 142, through the 2DEG 112, to the drain electrode 146 to produce the output current for the transistor. The gate electrode 144 in this example is formed over the barrier layer 120 and is configured for controlling the flow of the input current through the 2DEG 112.

The doped layer 130 in this example is formed between the barrier layer 120 and the gate electrode 144. The doped layer 130 is configured for depleting the 2DEG 112 under the gate electrode 144 at zero bias. In some embodiments, the doped layer 130 includes one or more group III-V compounds. For example, the doped layer 130 comprises p-type GaN. In addition, the doped layer 130 is doped with a dopant 132 for improving depletion ability of the doped layer 130. The high barrier of the p-GaN layer 130 can fully deplete the electron gas 112 at the portion under the gate electrode 144, by forming a depletion layer 125. In one embodiment, the dopant 132 is a p-type dopant comprising at least one of: carbon (C), iron (Fe), magnesium (Mg), and zinc (Zn).

As shown in FIG. 1, the doping concentration of the dopant 132 in the p-GaN layer 130 increases gradually from a top surface of the AlGaN barrier layer 120 to a bottom surface of the gate electrode 144. For example, the doping concentration may follow a parabolic function. In one example, the doped layer 130 includes (a) an interface layer (not shown) in contact with the barrier layer 120 and (b) a main layer (not shown) between the interface layer and the gate electrode 144. The doped layer 130 comprises a dopant 132 whose doping concentration in the interface layer is lower than that in the main layer. For example, the doping concentration of the dopant 132 in the interface layer is lowest at a surface of the barrier layer 120 and gradually increases as the dopant 132 is farther away from the surface of the barrier layer 120. The doping concentration of the dopant 132 in the interface layer may follow a parabolic function with a lowest concentration at the top surface of the barrier layer 120 and a highest concentration at a bottom surface of the main layer. In addition, the doping concentration of the dopant 132 in the main layer may be the same across the main layer and above a predetermined threshold, i.e. being kept at a high concentration level, to keep an activation of the dopant 132 for helping the p-GaN function of the gate electrode 144.

Figure 2:
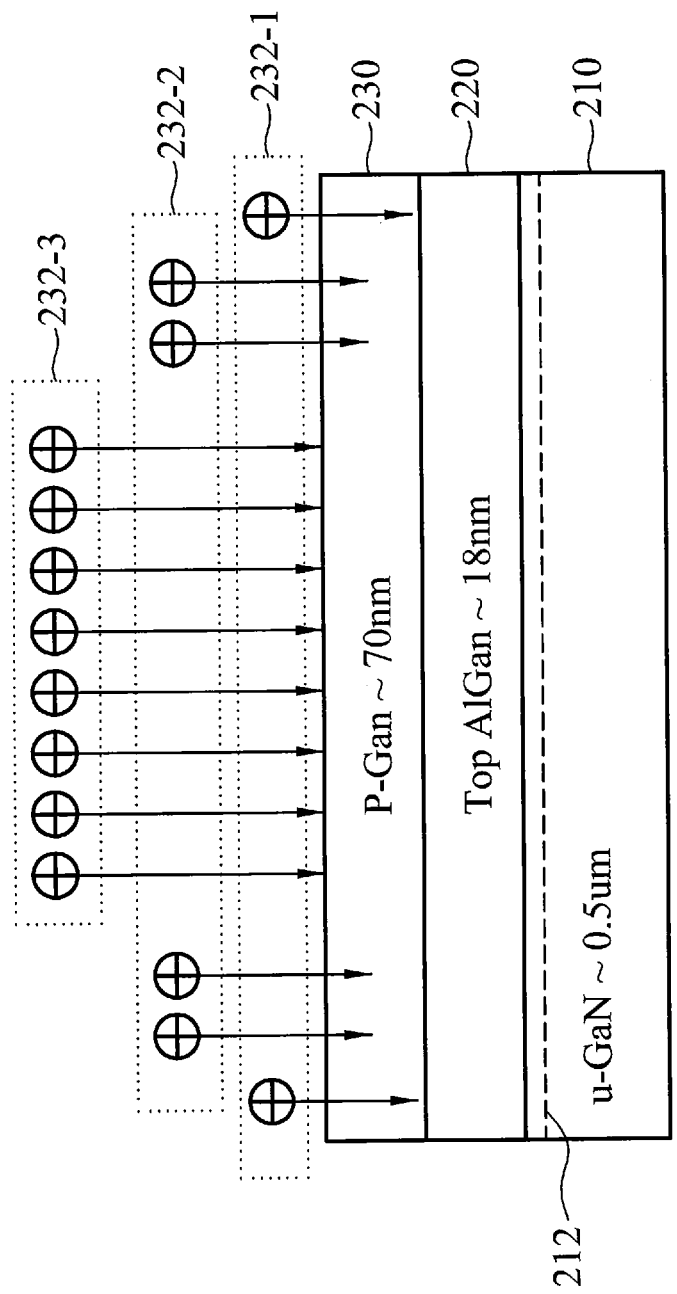
FIG. 2 illustrates a method for doping a dopant in an exemplary semiconductor structure, in accordance with some embodiments of the present disclosure.

FIG. 2 illustrates a method for doping a dopant 232 in an exemplary semiconductor structure, in accordance with some embodiments of the present disclosure. FIG. 2 shows a portion of a semiconductor structure, including a channel layer 210, a barrier layer 220, and a doped layer 230. The channel layer 210 has a channel potential energy for containing a 2DEG 212, for improving current performance of the semiconductor structure. In this example, the channel layer 210 comprises un-doped GaN. In one embodiment, the channel layer 210 is formed over a semiconductor substrate. In another embodiment, there may be other layers between the channel layer 210 and the substrate, e.g. a buffer layer, a transition layer, and/or an interlayer. In this example, the thickness of the channel layer 210 is about 0.5 micrometer.

The barrier layer 220 in this example is formed over the channel layer 210. The barrier layer 220 has a barrier potential energy for confining the 2DEG 212 in the channel layer 210. In this example, the barrier layer 220 comprises AlGaN and has a thickness of about 18 nanometers.

The doped layer 230 in this example is formed over the barrier layer 220 and is configured for depleting the 2DEG 212 at zero bias. In this example, the doped layer 230 comprises p-type GaN and has a thickness of about 70 nanometers. In addition, the doped layer 230 is doped with a dopant 232 for improving depletion ability of the doped layer 230. The high barrier of the p-GaN layer 230 can fully deplete the 2DEG 212. In one embodiment, the dopant 232 is a p-type dopant comprising at least one of: C, Fe, Mg, and Zn.

The dopant 232 may be put into the doped layer 230 while the 230 is growing. That is, the 230 and the 232 may be formed at the same time. The "doping" in this disclosure may refer to a process of putting a dopant into a layer either after the layer is formed or while the layer is growing.

As shown in FIG. 2, during the doping of the dopant 232, the doping concentration of the dopant 232 in the p-GaN layer 230 increases gradually from a top surface of the barrier layer 220 to a top surface of the doped layer 230. For example, the doping concentration of the bottom portion dopant 232-1 is lowest; the doping concentration of the top portion dopant 232-3 is highest; and the doping concentration of the middle portion dopant 232-2 is between the above two concentrations. As such, the distribution of the doping concentration along the vertical axis follows a parabolic function. In one example, the doped layer 230 includes (a) an interface layer (not shown) in contact with the barrier layer 220 and (b) a main layer (not shown) above the interface layer. The doping concentration of the dopant 232 in the interface layer is lower than that in the main layer. For example, the doping concentration of the dopant 232 in the interface layer is lowest at a top surface of the barrier layer 220 and gradually increases as the dopant 232 is farther away from the top surface of the barrier layer 220. The doping concentration of the dopant 232 in the interface layer may follow a parabolic function with a lowest concentration at the top surface of the barrier layer 220 and a highest concentration at a bottom surface of the main layer. In addition, the doping concentration of the dopant 232 in the main layer may be the same across the main layer and above a predetermined threshold, i.e. being kept at a high concentration level, to keep an activation of the dopant 232 for helping the p-GaN function, e.g. depletion of the 2DEG 212.

The different doping concentrations of the dopant 232 in the doped layer 230 can be achieved during the doping by controlling a doping flow rate of the dopant 232. For example, it can be controlled that the doping flow rate of the dopant 232-1 at the bottom portion of the doped layer 230 is lowest; the doping flow rate of the dopant 232-3 at the top portion of the doped layer 230 is highest; and the doping flow rate of the dopant 232-2 at the middle portion of the doped layer 230 is between the above two rates. As such, the distribution of the doping flow rate along the vertical axis may follow a parabolic function. In this manner, the out-diffusion of the dopant 232 into the barrier layer 220 is minimized or avoided.

In addition, to ensure activation of the dopant 232, a temperature of the dopant 232 is controlled during the doping such that the dopant 232 has a higher temperature in the main layer than that in the interface layer. For example, it can be controlled that the temperature of the dopant 232-1 at the bottom portion of the doped layer 230 is lowest; the temperature of the dopant 232-3 at the top portion of the doped layer 230 is highest; and the temperature of the dopant 232-2 at the middle portion of the doped layer 230 is between the above two temperatures during doping. As such, the distribution of the temperature during doping along the vertical axis may also follow a parabolic function. In this manner, the out-diffusion of the dopant 232 into the barrier layer 220 is minimized without losing the activation of the dopant 232 in the doped layer 230.

Figure 3:
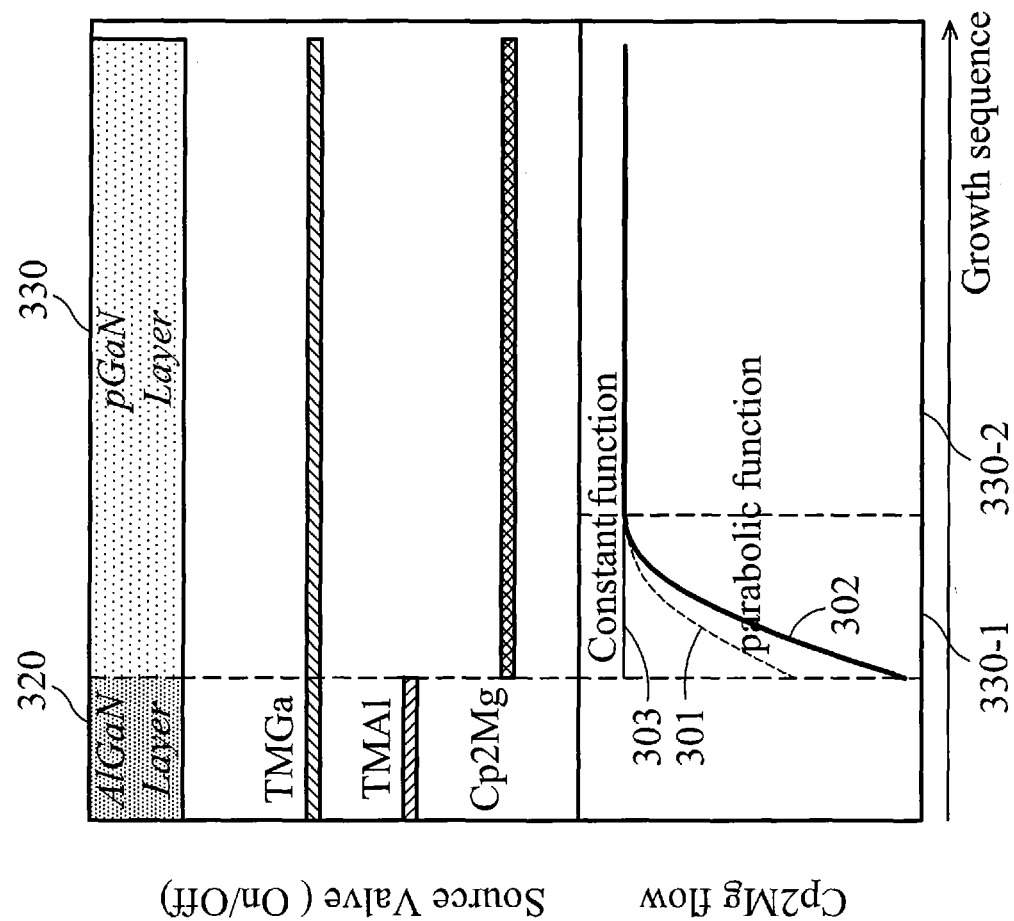
FIG. 3 illustrates exemplary controlled doping flow profiles during doping, in accordance with some embodiments of the present disclosure.

FIG. 3 illustrates exemplary controlled doping flow profiles during doping, in accordance with some embodiments of the present disclosure. FIG. 3 shows a portion of an epitaxial recipe of a transistor, e.g. a p-GaN gate HEMT, including an AlGaN layer 320, and a p-GaN layer 330 doped with Mg. The AlGaN layer 320 serves as a barrier layer, while the p-GaN layer 330 serves as a depletion control layer. The p-GaN layer 330 includes two sub-layers: an interface layer 330-1 and a main layer 330-2. According a growth sequence, during a manufacturing of the transistor, the AlGaN layer 320 is formed first, the interface layer 330-1 is formed the second, and the main layer 330-2 is formed the last.

In this example, while the Ga growing level is the same and follows a constant function 303 across the two sub-layers of the p-GaN layer 330, the Mg doping level is different in the two sub-layers. In the interface layer 330-1, the Mg doping profile follows a parabolic function, which makes initial Mg flow low at the surface of the AlGaN layer 320 to suppress Mg out-diffusion and makes Mg flow gradually increase as Mg is farther away from the AlGaN layer 320. In the main p-GaN layer 330-2, the Mg doping profile is kept at a high level to maintain the p-GaN function, e.g. depleting 2DEG region, switching off device at 0 volt, etc. According to different embodiments and different customer requests, different Mg doping profiles 301, 302 may be implemented. In one embodiment, the Mg doping profile may follow a function other than the parabolic function, so long as the Mg concentration is low at the surface of the AlGaN layer 320 in the interface layer 330-1 and becomes higher in the main p-GaN layer 330-2.

In this example, the Ga in the device is in form of trimethylgallium (TMGa); the Al in the AlGaN layer 320 is in form of trimethylaluminum (TMAl); and the Mg in the p-GaN layer 330 is in form of Cp2Mg. As shown in FIG. 3, a source valve for the TMGa is turned on during the formation of the AlGaN layer 320 and the p-GaN layer 330; a source valve for the TMAl is turned on during the formation of the AlGaN layer 320, but turned off during the formation of the p-GaN layer 330; and a source valve for the Cp2Mg is turned off during the formation of the AlGaN layer 320, but turned on during the formation of the p-GaN layer 330. As such, there is no Mg in the AlGaN layer 320. The Mg concentration is lower in the interface layer 330-1 than that in the main layer 330-2.

In one embodiment, when the p-GaN layer 330 is being formed, Ga and Mg are grown/doped together but with different growing/doping flow rates. While the Ga growing flow rate reaches a desired level from the beginning of the growing, the Mg doping flow rate starts at a low level and increases to a desired level as the p-GaN layer 330 grows, i.e. as the Mg doping becomes farther away from the AlGaN layer 320.

Figure 4:
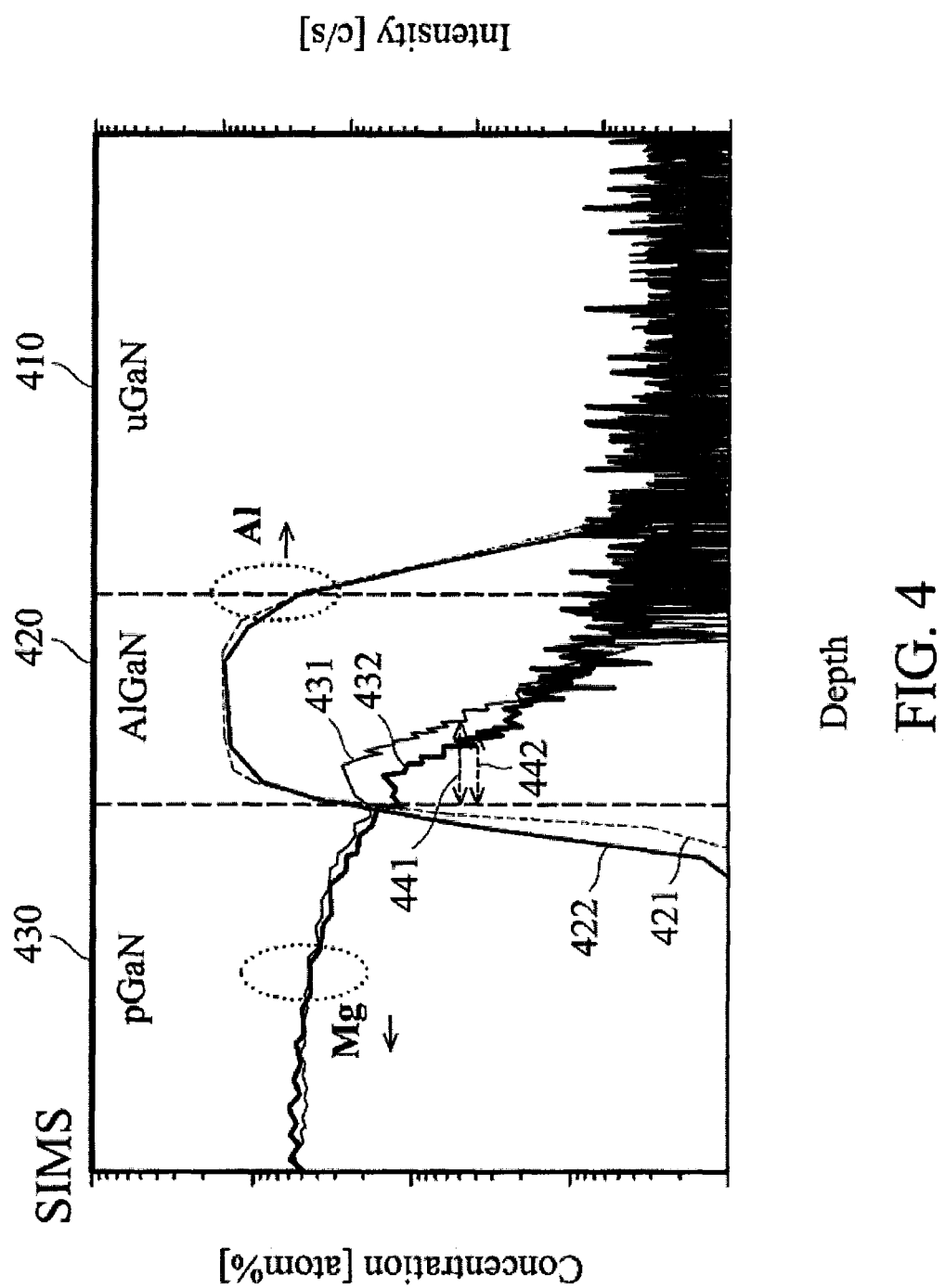
FIG. 4 illustrates dopant diffusion performances of different doping methods, in accordance with some embodiments of the present disclosure.

FIG. 4 illustrates dopant diffusion performances of different doping methods, in accordance with some embodiments of the present disclosure. FIG. 4 shows a portion of a transistor, e.g. a p-GaN gate HEMT, including an un-doped GaN layer 410, an AlGaN layer 420, and a p-GaN layer 430 doped with Mg, based on secondary ion mass spectrometry (SIMS). The un-doped GaN layer 410 serves as a channel layer; the AlGaN layer 420 serves as a barrier layer; and the p-GaN layer 430 serves as a depletion control layer. According the depth information, the un-doped GaN layer 410 is deepest among the three layers shown in FIG. 4. The AlGaN layer 420 is formed over the un-doped GaN layer 410; and the p-GaN layer 430 is formed over the AlGaN layer 420.

Because all of the three layers in FIG. 4 comprise GaN, the boundaries of different layers are identified by a concentration of Al in different regions or at different depths of the three layers. As shown in FIG. 4, the boundaries of the AlGaN layer 420 may be identified at the depths where the concentration of Al drops below a certain threshold. FIG. 4 compares the performance of a disclosed method according to one embodiment and that of a baseline method. The baseline method does not control the flow rate of the Mg during doping such that the doping flow rate of the Mg is the same from the beginning to the end of the Mg doping. As shown in FIG. 4, the Al concentration profile 422 based on the disclosed method and the Al concentration profile 421 based on the baseline method shows a same identification for the boundaries of the three layers. But the Mg concentration profile 432 based on the disclosed method and the Mg concentration profile 431 based on the baseline method shows different Mg out-diffusion depths into the AlGaN layer 420. As shown in FIG. 4, the Mg concentration profile 432 based on the disclosed method has a Mg out-diffusion depth 442, which is less than the Mg out-diffusion depth 441 of the Mg concentration profile 431 based on the baseline method. In addition, compared to the Mg concentration profile 431 based on the baseline method, the Mg concentration profile 432 based on the disclosed method has a lower Mg concentration at the bottom portion of the p-GaN layer 430, i.e. near the interface between the p-GaN layer 430 and the AlGaN layer 420, and keeps a high Mg concentration at the top portion of the p-GaN layer 430. In this manner, the Mg out-diffusion into the AlGaN layer 420 is reduced while the activation of Mg in the p-GaN layer 430 is kept at a high level.

Figure 5:
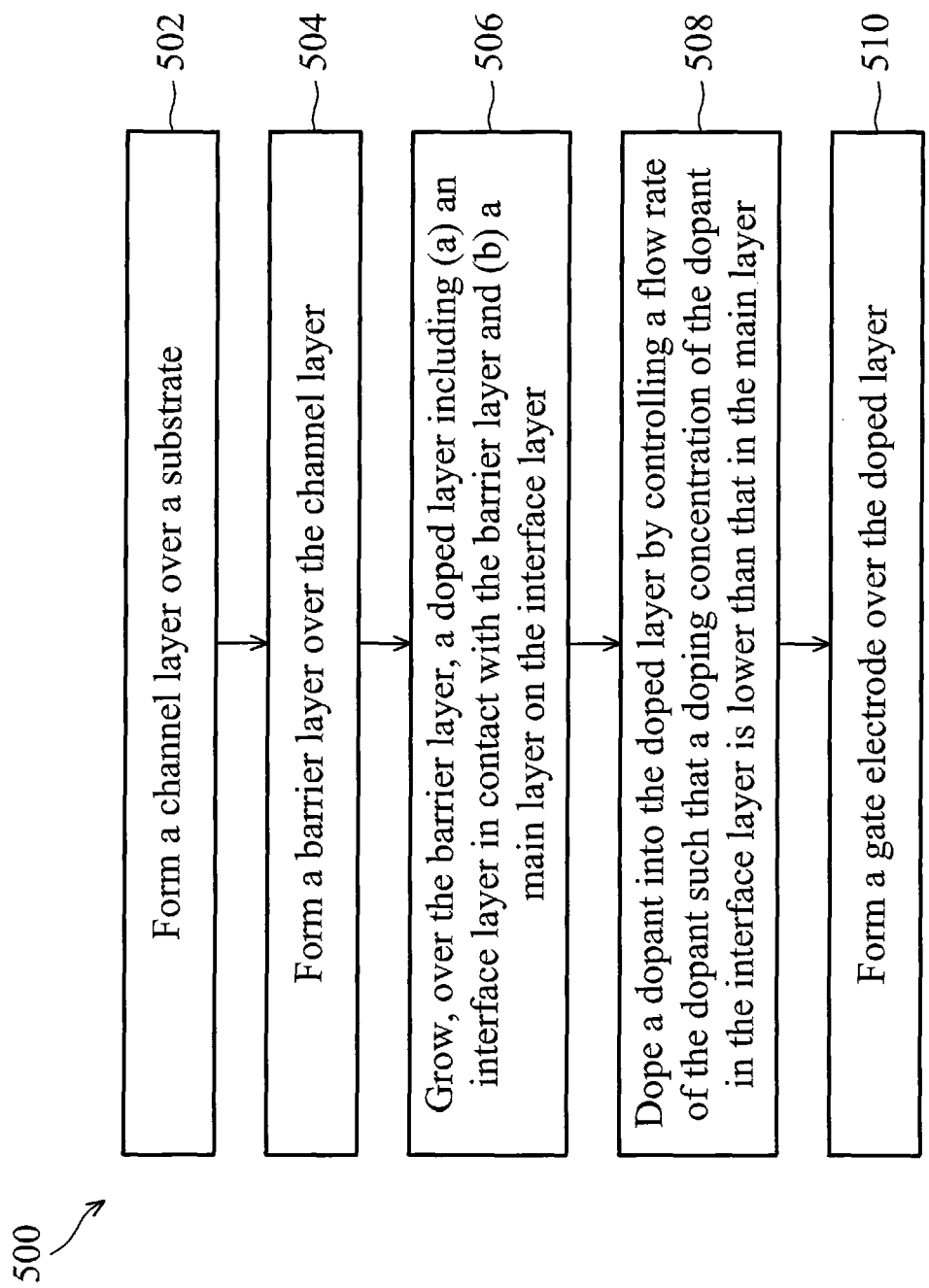
FIG. 5 is a flow chart illustrating an exemplary method for manufacturing a semiconductor structure with controlled dopant diffusion and activation, in accordance with some embodiments of the present disclosure.

FIG. 5 is a flow chart illustrating an exemplary method 500 for manufacturing a semiconductor structure with controlled dopant diffusion, in accordance with some embodiments of the present disclosure. At operation 502, a channel layer is formed over a substrate. A barrier layer is formed at operation 504 over the channel layer. At operation 506, a doped layer is grown over the barrier layer. The doped layer includes: (a) an interface layer in contact with the barrier layer and (b) a main layer on the interface layer. A dopant is doped at operation 508 into the doped layer by controlling a flow rate of the dopant such that a doping concentration of the dopant in the interface layer is lower than that in the main layer. In one embodiment, the operations 506 and 508 are combined and performed together. That is, the dopant is doped into the doped layer while the doped layer is grown over the barrier layer. At operation 510, a gate electrode is formed over the doped layer. In one embodiment, the order of the operations shown in FIG. 5 may be changed according to different embodiments of the present disclosure.

Figure 6:
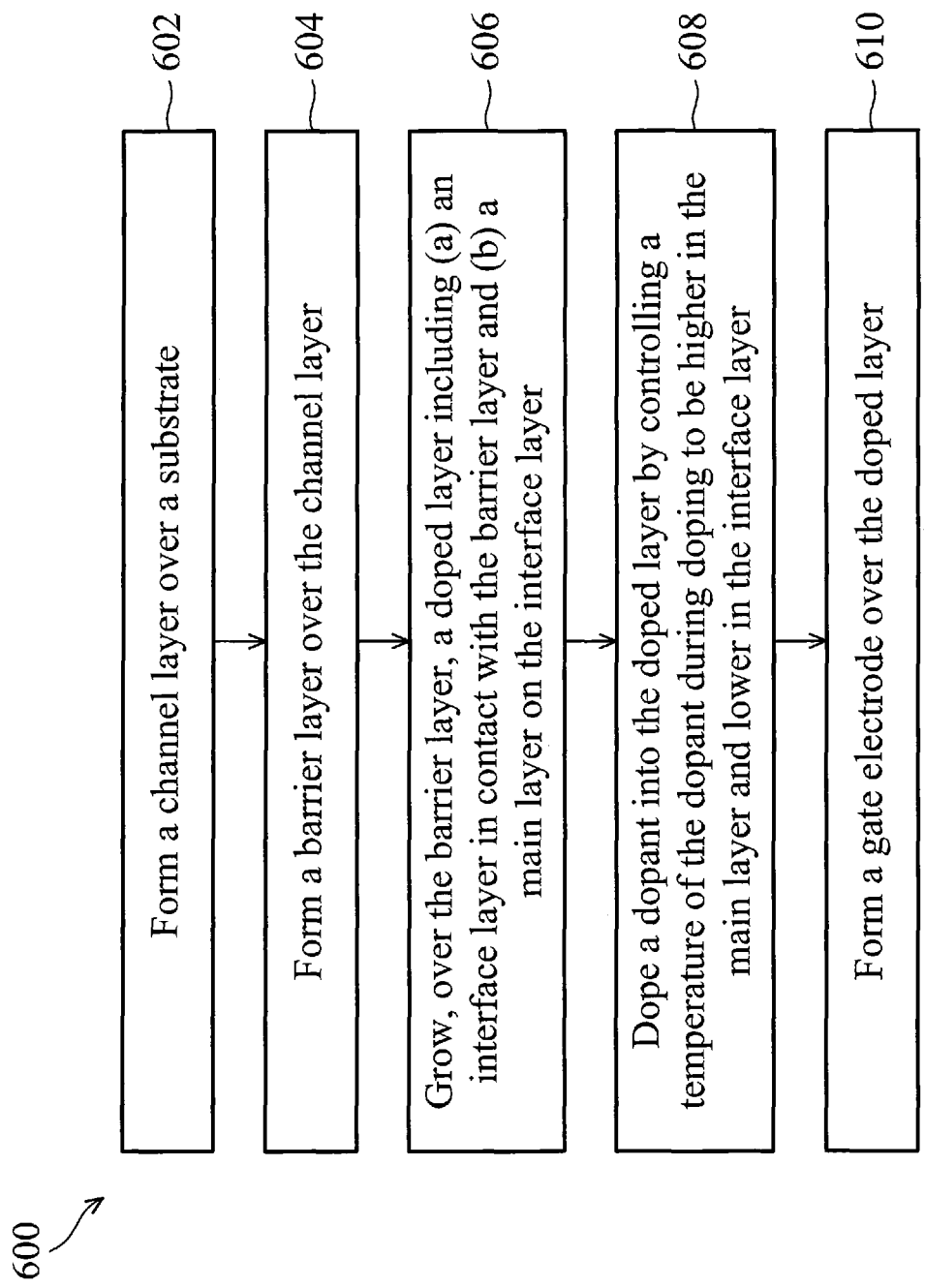
FIG. 6 is a flow chart illustrating another exemplary method for manufacturing a semiconductor structure with controlled dopant diffusion and activation, in accordance with some embodiments of the present disclosure.

FIG. 6 is a flow chart illustrating another exemplary method 600 for manufacturing a semiconductor structure with controlled dopant diffusion, in accordance with some embodiments of the present disclosure. At operation 602, a channel layer is formed over a substrate. A barrier layer is formed at operation 604 over the channel layer. At operation 606, a doped layer is grown over the barrier layer. The doped layer includes: (a) an interface layer in contact with the barrier layer and (b) a main layer on the interface layer. A dopant is doped at operation 608 into the doped layer by controlling a temperature of the dopant during doping to be higher in the main layer and lower in the interface layer. In one embodiment, the operations 606 and 608 are combined and performed together. That is, the dopant is doped into the doped layer while the doped layer is grown over the barrier layer. At operation 610, a gate electrode is formed over the doped layer. In one embodiment, the order of the operations shown in FIG. 6 may be changed according to different embodiments of the present disclosure.

In an embodiment, a semiconductor structure is disclosed. The semiconductor structure includes: a channel layer; a barrier layer over the channel layer; a gate electrode over the barrier layer; and a doped layer formed between the barrier layer and the gate electrode. The doped layer includes (a) an interface layer in contact with the barrier layer and (b) a main layer between the interface layer and the gate electrode. The doped layer comprises a dopant whose doping concentration in the interface layer is lower than that in the main layer.

In another embodiment, a method for manufacturing a semiconductor structure is disclosed. The method includes: forming a channel layer; forming a barrier layer over the channel layer; growing, over the barrier layer, a doped layer including (a) an interface layer in contact with the barrier layer and (b) a main layer on the interface layer, by doping a dopant into the doped layer; and forming a gate electrode over the doped layer. A flow rate of the dopant is controlled during the doping such that a doping concentration of the dopant in the interface layer is lower than that in the main layer.

In yet another embodiment, a method for manufacturing a semiconductor structure is disclosed. The method includes: forming a channel layer; forming a barrier layer over the channel layer; growing, over the barrier layer, a doped layer including (a) an interface layer in contact with the barrier layer and (b) a main layer on the interface layer, by doping a dopant into the doped layer; and forming a gate electrode over the doped layer. A temperature of the dopant is controlled during the doping such that the dopant has a higher temperature in the main layer than that in the interface layer.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a channel layer;
a barrier layer over the channel layer;
a gate electrode over the barrier layer; and
a doped layer formed between the barrier layer and the gate electrode, wherein:
the doped layer includes (a) an interface layer in contact with the barrier layer and (b) a main layer between the interface layer and the gate electrode,
the doped layer comprises a dopant whose doping concentration in the interface layer is lower than that in the main layer, and
the doping concentration of the dopant in the interface layer follows a parabolic function from a lowest concentration at a surface of the barrier layer to a highest concentration at a surface of the main layer.

2. The semiconductor structure of claim 1, wherein:
the channel layer has a channel potential energy for containing a two dimensional electron gas (2DEG); and
the barrier layer has a barrier potential energy for confining the 2DEG in the channel layer.

3. The semiconductor structure of claim 2, further comprising:
a source electrode configured for supplying an input current to the 2DEG; and
a drain electrode configured for supplying an output current, wherein the input current flows from the source electrode, through the 2DEG, to the drain electrode to produce the output current, wherein the gate electrode is configured for controlling the flow of the input current through the 2DEG.

4. The semiconductor structure of claim 2, wherein:
the doped layer is configured for depleting the 2DEG under the gate electrode at zero bias; and
the dopant in the doped layer is configured for improving depletion ability of the doped layer.

5. The semiconductor structure of claim 1, wherein the dopant is a p-type dopant comprising at least one of: carbon (C), iron (Fe), magnesium (Mg), and zinc (Zn).

6. The semiconductor structure of claim 1, wherein the doping concentration of the dopant in the main layer is the same across the main layer and is above a predetermined threshold.

7. The semiconductor structure of claim 1, wherein:
the channel layer comprises a first III-V compound;
the barrier layer comprises a second III-V compound; and
the doped layer comprises a third III-V compound and the dopant.

8. The semiconductor structure of claim 7, wherein:
the channel layer comprises un-doped gallium nitride (GaN);
the barrier layer comprises aluminum gallium nitride (AlGaN); and
the doped layer comprises p-type GaN and the dopant.

9. A semiconductor structure, comprising:
a channel layer;
a barrier layer over the channel layer;
a gate electrode over the barrier layer; and
a doped layer formed between the barrier layer and the gate electrode, wherein:
the doped layer includes (a) an interface layer in contact with the barrier layer and (b) a main layer between the interface layer and the gate electrode,
the doped layer comprises a dopant whose doping concentration in the interface layer is lower than that in the main layer,
the doping concentration of the dopant in the interface layer is lowest at a surface of the barrier layer and gradually increases as the dopant is farther away from the surface of the barrier layer, and
the doping concentration of the dopant in the main layer is the same across the main layer and is above a predetermined threshold.

10. The semiconductor structure of claim 9, wherein:
the channel layer has a channel potential energy for containing a two dimensional electron gas (2DEG).

11. The semiconductor structure of claim 10, wherein:
the barrier layer has a barrier potential energy for confining the 2DEG in the channel layer.

12. The semiconductor structure of claim 10, further comprising:
a source electrode configured for supplying an input current to the 2DEG; and
a drain electrode configured for supplying an output current, wherein the input current flows from the source electrode, through the 2DEG, to the drain electrode to produce the output current, wherein the gate electrode is configured for controlling the flow of the input current through the 2DEG.

13. The semiconductor structure of claim 10, wherein:
the doped layer is configured for depleting the 2DEG under the gate electrode at zero bias.

14. The semiconductor structure of claim 9, wherein:
the dopant in the doped layer is configured for improving depletion ability of the doped layer.

15. The semiconductor structure of claim 9, wherein the dopant is a p-type dopant comprising at least one of: carbon (C), iron (Fe), magnesium (Mg), and zinc (Zn).

16. The semiconductor structure of claim 9, wherein the doping concentration of the dopant in the interface layer follows a parabolic function with a lowest concentration at the surface of the barrier layer and a highest concentration at a surface of the main layer.

17. The semiconductor structure of claim 9, wherein:
the channel layer comprises a first III-V compound;
the barrier layer comprises a second III-V compound; and
the doped layer comprises a third III-V compound and the dopant.

18. The semiconductor structure of claim 9, wherein:
the channel layer comprises un-doped gallium nitride (GaN);
the barrier layer comprises aluminum gallium nitride (AlGaN); and
the doped layer comprises p-type GaN and the dopant.

* * * * *